United States Patent [19]

Mang et al.

[11] Patent Number: 4,678,535

[45] Date of Patent: Jul. 7, 1987

[54] PROCESS FOR PRODUCING CRYSTALS

[75] Inventors: Hermenegild Mang; Günter Engel, both of Graz, Austria

[73] Assignee: Avl Gesellschaft für Verbrennungskraftmaschinen und Messtechnik mbH, Graz, Austria

[21] Appl. No.: 744,303

[22] Filed: Jun. 13, 1985

Related U.S. Application Data

[63] Continuation-in-part of Ser. No. 479,081, Mar. 25, 1983, abandoned.

[30] Foreign Application Priority Data

Mar. 30, 1982 [AT] Austria ................................. 1260/82

[51] Int. Cl.$^4$ .......................... C30B 29/14; C30B 7/10; C01B 25/26
[52] U.S. Cl. ................................ 156/623 R; 156/621; 423/305; 423/311
[58] Field of Search ........... 156/623 R, 621, DIG. 70, 156/DIG. 81, DIG. 61; 423/305, 311

[56] References Cited

U.S. PATENT DOCUMENTS 4,247,358 1/1981 Auloir ................................. 156/601
4,382,840 5/1983 Chai et al. ...................... 156/623 R
4,579,622 4/1986 Caporaso et al. .............. 156/623 R

OTHER PUBLICATIONS

Kolb et al., Jl of Crystal Growth 50 (1980) 404–18.
Poignant et al., Mat Res. Bull., vol. 14, No. 5, pp. 603–612, 1979.
Perloff, Jl. of Am. Ceramic Soc., vol. 39, No. 3, 3/1/56.

Primary Examiner—Gary P. Straub
Attorney, Agent, or Firm—Watson, Cole, Grindle & Watson

[57] ABSTRACT

In a process for producing crystals in crystallographic point group 32 and corresponding to the comprehensive chemical formula $APO_4$, wherein symbol A is a chemical element taken from the group Al and Ga, P is phosphorus and O is oxygen, from heated solutions of salts of group A in phosphorus acid, the application of acid concentrations within the range of 12.5 to 20 mol/l, solution temperatures within the range of 110° to 190° C. and total pressures within the range of prevailing static vapour pressure to 2.5 bar provides a simple, safe and cost-effective method of producing perfect, flawless crystals.

4 Claims, No Drawings

1

PROCESS FOR PRODUCING CRYSTALS

CROSS-REFERENCE TO RELATED APPLICATION

The present application is a continuation-in-part of application Ser. No. 479,081, filed Mar. 25, 1983, now abandoned.

BACKGROUND OF THE INVENTION

The invention relates to a process of producing crystals in crystallographic point group 32 which correspond to the comprehensive chemical formula $APO_4$, symbol A being a chemical element taken from the group Al and Ga, P is phosphorus and O is oxygen from heated solutions of salts of group A in phosphorus acid. The salts may also be produced by heating the corresponding oxide in the phosphorus acid under reflux.

The hitherto known processes of the kind specified for growing monocrystals of the type specified require the use of sealed pressure vessels because of the utilized process parameters such as pressures, temperatures and acid concentrations. This makes it difficult to visually monitor the growth of the crystals. In addition, such sealed pressure vessels are costly and always present certain safety risks.

By way of example a process of producing $AlPO_4$-monocrystals is known in which total pressures of between 7 and 35 bar are applied inside the pressure vessel containing the heated solution. Also known in this context is the use of 6.1 molar $H_3PO_4$ at 250° C. or 70 to 700 bar.

SUMMARY OF THE INVENTION

It is an aim of the present invention to improve a process of the kind specified in such a way as to allow working at lower pressures whilst at the same time obtaining perfect and flawless crystals in a simple, safe and cost-effective manner.

According to the invention the single crystals which have a comprehensive chemical formula of $APO_4$, symbol A being a chemical element selected from Al and Ga, P being phosphorus and O being oxygen, are formed by (1) preparing a heated solution of a salt containing a symbol A element and phosphorus acid, (2) maintaining the actual acid concentration of the solution within the range of 12.5 to 20 mol/l, (3) maintaining the temperature of the solution within the range of 110° to 190° C. and (4) maintaining the total pressure over the solution of between the prevailing static vapor pressure to 2.5 bar, until the single crystals are formed from the solution.

It is known per se that in the above specified solution systems the vapour pressure above the solutions and thus the total internal pressure at a given temperature may be lowered by increasing the prevailing acid concentration. On the other hand, such an increase in acid concentration entails the danger that as a result not the desired $APO_4$-crystals but acid salts may be obtained from the corresponding acid or polyacids. For this reason the industry concerned has so far refrained in respect of the above-mentioned process from increasing acid concentrations beyond values of the order of 6.1 mol/l and the relevant literature actually warned against such a step.

However, it was found quite surprisingly that, with an increase in acid concentration over 12.5 mol/l whilst maintaining the above-specified total pressure and temperature ranges, there is neither any interference with the growth of the desired $APO_4$-crystals nor any formation of acid salts.

Available literature data, for example for the phosphoric acid/water system, reveal for example for 20.7 molar phosphoric acid which no longer contains any free water, a normal boiling temperature of 300° C. This temperature is raised further by salts in solution so that, for example, with such a solution at 190° C. one can already work at atmospheric pressure. By contrast, with a phosphoric acid concentration of 6.1 mol/l as currently used in conventional processes, the boiling point is at about 150° C. so that at 190° C. pressure will be in excess of 20 bar.

A process which is known from U.S. Pat. No. 4,247,358 operates with, admittedly, relatively low temperatures (150° C.–165° C.), but, like all other known processes concerning $AlPO_4$, with 6 mol/l phosphoric acid. The resulting pressure of about 7 bar must therefore be resisted by appropriate provisions.

In other words, by applying the process according to the present invention it is possible, owing to the higher acid concentration, to operate at lower temperatures and lower pressures which, in view of the lower risk of inherent sources of potential fault factors, results in a net improvement in the quality of the crystals. Due to the low water concentration the builtin probability of water-faults is lessened which also improves the quality of the monocrystals.

Furthermore, the application of lower pressures and temperatures reduces the costs for maintaining the required degree of operational safety and allows the use of glass vessels which allow visual control of crystal growth.

In this context it is of particular advantage if, according to a preferred embodiment of the invention, the total pressure maintained in step (4) is equal to atmospheric pressure, inasmuch as this allows complicated sealing means as well as means and devices for maintaining total pressure at a constant level to be wholly dispensed with. The expression "total pressure" as used herein always refers to the sum of the partial pressures since the filling levels of the vessels are always below 100%; that is to say, since the operation is always in the two-phase, gasliquid state. In that case, if no foreign gas is present, total pressure is equal to the equilibrium or static vapour pressure of the solution of the critical temperature.

If a foreign gas is present, as is the general rule when air is not excluded, the process may be operated, for example with the aid of an excess-pressure valve, in such a manner that total pressure remains equal to atmospheric pressure for as long as the vapour pressure of the solution remains below atmospheric pressure. By applying a stronger pre-tension to the excess-pressure valve, it is then possible to adjust the total pressure up to the 2.5 bar hereinbefore specified.

In another preferred embodiment of the invention the total acid concentration is maintained in step (2) by supplying steam over the solution prepared in step (1) which has a pressure equal to the prevailing static vapor pressure up to 1 bar. In another preferred embodiment step (3) includes raising the temperature of the solution prepared in step (1) by 0.1 to 3° C. per day, starting from a temperature above 120° C., until a temperature below 150° C. is reached (in this embodiment the total pressure in step (4) is maintained below 1 bar). In a further preferred embodiment step (3) includes raising the temperature of the solution prepared in step (1) by 0.1 to 3° C. per day, starting from a temperature above 170° C., until a temperature of 190° C. is reached. In this latter embodiment, the actual acid concentration in step (2) is maintained over 13 mol/l and is controlled by supplying steam over the solution with a pressure equal to the prevailing static vapor pressure up to 2.5 bar.

EXAMPLE 1

In an Erlenmayer flask surmounted by a reflux condenser 29 g of gallium oxide are heated with 300 ml of 85% phosphoric acid (14.6 mol/l) in an oil bath for 70 hours, the solution obtained is then decanted, spun in a centrifuge and poured into thick-walled, screw-stoppered test tubes of heat-resistant glass.

The filling level is up to 60%. The tubes, some closed, some open, are subjected in a fluid thermostat (±0.01° C.) or in a drying cabinet (±0.5° C.) to a temperature increase of from 0.5° C. up to 1° C. per day, starting at 150° C., for twenty days. Total pressures will then vary from about 0.6 bar at 150° C. to about 2.5 bar at 190° C. In the closed tubes crystallization takes place by virtue of the retrograde solubility of $GaPO_4$ in $H_3PO_4$, whereas in the open glass tubes a crystallization process takes place by virtue of a combination of solvent extraction and retrograde solubility. Transparent, clear-as-water, rhombohedral crystals of up to 200 mg are formed which may then be used as seed crystals for further growth experiments.

EXAMPLE 2

120 g of $Ga_2O_3$ are hydrolized for 1 week at 120° C. while stirring vigorously with 1 liter of 85% phosphoric acid in a three neck flask with reflux cooling and a stirrer. The powdery $Ga_2O_3$ is changed at the same time into a crystalline phosphate. After that, the temperature is lowered to 110° C. and stirring is continued for 1 day. The solution is then decanted quickly, optionally filtered and is further processed as in Example 1. The temperature begins to rise at 110° C.

We claim:

1. A process for producing single cyrstals which have a comprehensive chemical formula of $APO_4$, symbol A being a chemical element selected from Al and Ga, P being phosphorus, and O being oxygen, said process comprising the steps of
  (1) preparing a solution of aluminum or gallium phosphate in 12.5–20 molar phosphoric acid and saturating said solution at a temperature of at least 110° C. and less than 190° C.,
  (2) providing steam over said solution prepared in step (1) at a pressure equal to or greater than the prevailing static vapor pressure to maintain the actual acid concentration of said solution within the range of 12.5 to 20 mol/l,
  (3) raising the temperature of said solution by at least 10° C. in increments of 0.1° to 3° C. per day, starting from the saturation temperature in step (1), until a temperature which is still below 190° C. is reached, and
  (4) during steps (1) to (3), maintaining the total pressure over said solution at about atmospheric pressure until said crystals are formed from said solution.

2. A process as defined in claim 1, wherein the temperature in step (1) is above 120° C., and wherein in step (3) the temperature of said solution is raised by 0.1° to 3° C. per day until a temperature below 150° C. is reached.

3. A process for producing single crystals which have a comprehensive chemical formula of $APO_4$, symbol A being a chemical element selected from Al and Ga, P being phosphorus, and O being oxygen, said process comprising the steps of
  (1) preparing a solution of aluminum or gallium phosphate in 12.5–20 molar phosphoric acid and saturating said solution at a temperature of about 150° C.,
  (2) providing steam over said solution prepared in step (1) at a pressure equal to or greater than the prevailing static vapor pressure to maintain the actual acid concentration of said solution within the range of 12.5 to 20 mol/l,
  (3) raising the temperature of said solution by 0.5 to 1° C. per day for twenty days, starting from the saturation temperature of about 150° C., until a higher temperature is reached, and
  (4) during steps (1) to (3), maintaining the total pressure over said solution between about 0.6 bar to about 2.5 bar until said crystals are formed from said solution.

4. A process for producing single cyrstals which have a comprehensive chemical formula of $APO_4$, symbol A being a chemical element selected from Al and Ga, P being phosphorus, and O being oxygen, said process comprising the steps of
  (1) preparing a solution of aluminum or gallium phosphate in phosphoric acid with an acid concentration over 13 mol/l and saturating said solution at a temperature above 170° C. and less than 190° C.,
  (2) providing steam over said solution prepared in step (1) at a pressure equal to or greater than the prevailing static vapor pressure to maintain the actual acid concentration of said solution over 13 mol/l,
  (3) raising the temperature of said solution by at least 10° C. in increments of 0.1° to 3° C. per day, starting from the saturation temperature in step (1), until a temperature of 190° C. is reached, and
  (4) during steps (1) to (3), maintaining the total pressures over said solution at less than 2.5 bar until said crystals are formed from said solution.

* * * * *

UNITED STATES PATENT AND TRADEMARK OFFICE
CERTIFICATE OF CORRECTION

PATENT NO. : 4,678,535

DATED : July 7, 1987

INVENTOR(S) : Hermenegild Mang et al.

It is certified that error appears in the above-identified patent and that said Letters Patent is hereby corrected as shown below:

Title page:

[73] Assignee: AVL Gesellschaft für Verbrennungskraftmaschinen und Messtechnik mbH. Prof.Dr.Dr.hc. Hans List.

Signed and Sealed this

Seventeenth Day of November, 1987

Attest:

DONALD J. QUIGG

Attesting Officer

Commissioner of Patents and Trademarks